(12) United States Patent
Tanzawa

(10) Patent No.: US 8,971,117 B2
(45) Date of Patent: Mar. 3, 2015

(54) APPARATUS AND METHODS FOR APPLYING A NON-ZERO VOLTAGE DIFFERENTIAL ACROSS A MEMORY CELL NOT INVOLVED IN AN ACCESS OPERATION

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 542 days.

(21) Appl. No.: 13/403,109

(22) Filed: Feb. 23, 2012

(65) Prior Publication Data

US 2013/0223150 A1 Aug. 29, 2013

(51) Int. Cl.
*G11C 16/04* (2006.01)
(52) U.S. Cl.
USPC .......... 365/185.17; 365/189.09; 365/228
(58) Field of Classification Search
CPC ........... G11C 16/10; G11C 16/0483; G11C 16/3427; G11C 16/3459
USPC ............... 365/185.17, 189.09, 228
See application file for complete search history.

(56) References Cited

U.S. PATENT DOCUMENTS

| | | | |
|---|---|---|---|
| 5,905,675 A | 5/1999 | Madurawe et al. | |
| 6,347,053 B1 | 2/2002 | Kim et al. | |
| 7,161,840 B2 | 1/2007 | Jung | |
| 7,358,558 B2 | 4/2008 | Lee | |
| 7,551,508 B2* | 6/2009 | Joshi et al. | 365/226 |
| 7,983,085 B2* | 7/2011 | Tamada | 365/185.13 |
| 2009/0273984 A1 | 11/2009 | Tanzawa | |
| 2010/0202201 A1* | 8/2010 | Tamada | 365/185.05 |
| 2011/0075486 A1 | 3/2011 | Liao et al. | |
| 2011/0299353 A1 | 12/2011 | Ito et al. | |
| 2012/0051144 A1* | 3/2012 | Weingarten et al. | 365/185.24 |
| 2012/0287740 A1* | 11/2012 | Vimercati | 365/203 |
| 2014/0241049 A1* | 8/2014 | Vimercati et al. | 365/163 |

* cited by examiner

*Primary Examiner* — Tuan T Nguyen
(74) *Attorney, Agent, or Firm* — Dicke, Billig & Czaja, PLLC

(57) ABSTRACT

Apparatus and methods for applying a non-zero voltage differential across a memory cell not involved in an access operation can facilitate improved data retention characteristics.

39 Claims, 8 Drawing Sheets

APPARATUS AND METHODS FOR APPLYING A NON-ZERO VOLTAGE DIFFERENTIAL ACROSS A MEMORY CELL NOT INVOLVED IN AN ACCESS OPERATION

TECHNICAL FIELD

The present disclosure relates generally to memory and, in particular, in one or more embodiments, the present disclosure relates to methods for applying a non-zero voltage differential across a memory cell not involved in an access operation and apparatus configured to perform such methods.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltages of the memory cells, through programming (which is often referred to as writing) of data-storage structures, using charge-storage structures (e.g., floating gates or charge traps) or other physical phenomena (e.g., phase change or polarization), determine the data state of each cell. Common uses for flash memory include personal computers, personal digital assistants (PDAs), digital cameras, digital media players, cellular telephones, solid state drives and removable memory modules, and the uses are growing.

There is a continuing desire to increase memory density, e.g., the number of bits of data that can be stored for a given integrated circuit die area. However, as memory density increases, issues with data retention tend to worsen.

For the reasons stated above, and for other reasons stated below which will become apparent to those skilled in the art upon reading and understanding the present specification, there is a need in the art for alternative methods for facilitating improvements in data retention.

DETAILED DESCRIPTION

Figure 1:
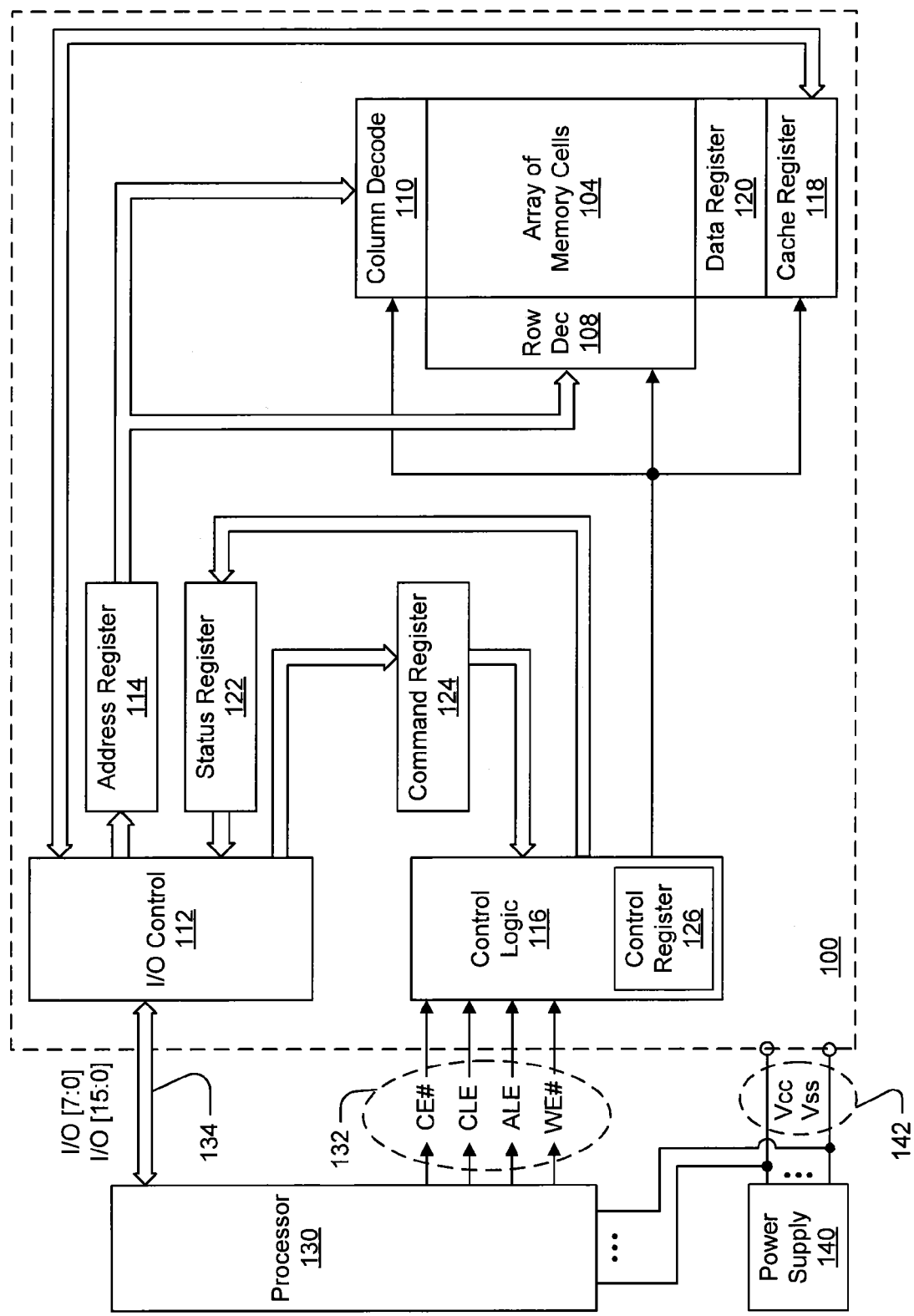
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

As memory cells are scaled down, neutral Vt tends to decrease due to short channel effects. Data retention characteristics can become worse if threshold voltages used to define data states are not altered to place the neutral Vt toward the median of those threshold voltages. However, driving threshold voltage ranges more negative may not be feasible.

To facilitate improved data retention characteristics of memory cells, various embodiments seek to reduce the average electric field across gate dielectrics of a group of memory cells during a standby state, i.e., while those memory cells are not currently involved in an access operation. As used herein, involvement in an access operation means that the memory cell would receive an applied bias to one or more of its nodes (e.g., control gate, body, source and/or drain) as part of the operation to access (e.g., read, program or erase) one or more memory cells. For example, during a read operation addressed to one or more selected memory cells of a block of memory cells of a NAND memory array, all memory cells of the block of memory cells may be involved in the read operation as typically all memory cells coupled to the same access line of the one or more selected memory cells receive a read voltage applied to their control gates, and all remaining memory cells of the block of memory cells would typically receive a pass voltage applied to their control gates to act as pass transistors while the selected memory cells are being sensed. Thus, memory cells involved in an access operation includes both memory cells selected for the access operation and memory cells that would receive an applied bias to facilitate the access operation on the selected memory cells.

FIG. 1 is a simplified block diagram of a first apparatus in the form of a memory device 100 in communication with a second apparatus, in the form of a processor 130, and a third apparatus, in the form of a power supply 140, as part of a fourth apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like. The processor 130 may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

Control logic 116 controls access to the array of memory cells 104 in response to the commands and generates status information for the external processor 130. The control logic 116 is in communication with row decode circuitry 108 and column decode circuitry 110 to control the row decode circuitry 108 and column decode circuitry 110 in response to the addresses. The control logic 116 includes a control register 126. The control logic 116 is configured to selectively operate the memory device 100 in a retention mode of operation in accordance with an embodiment. For some embodiments, control register 126 includes a register (e.g., a 1-bit register) whose value (e.g., logic level) is indicative of whether the retention mode of operation is enabled or disabled such that the control logic 116 could be configured to perform the retention mode of operation if the value of this retention mode of operation enable register indicates that the retention mode of operation is enabled. For some embodiments, control logic 116 could be configured to perform a retention mode of operation in accordance with an embodiment in response to a command received from the processor 130 and written to the command register 124.

Control logic 116 is also in communication with a cache register 118. Cache register 118 latches data, either incoming or outgoing, as directed by control logic 116 to temporarily store data while the array of memory cells 104 is busy writing or reading, respectively, other data. During a write operation, data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Status register 122 may include a ready/busy register. For example, a 1-bit register could be used to indicate whether the memory device 100 is busy (e.g., that the memory device 100 is performing an access operation) or ready (e.g., that the memory device 100 has completed, or is not performing, an access operation). Thus, reading the status register 122, such as by the processor 130 or the control logic 116, could be used to determine whether the memory device 100 is involved in an access operation or not, e.g., whether or not the memory device is ready to initiate an access operation. Alternatively, or in addition, the control logic 116 of memory device 100 might provide a ready/busy (R/B#) signal to provide an indication to processor 130 of whether or not the memory device 100 is involved in an access operation. For example, memory devices often provide a pin (e.g., a pin of control link 132) that is asserted to a logic low, for example, when the device is involved in an access operation and is pulled up to a logic high when the device is again available (e.g., not involved in an access operation).

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received or provided over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data, e.g., from the array of memory cells 104 or the status register 122, are also output over input/output (I/O) pins [7:0] for an 8-bit device or input/output (I/O) pins [15:0] for a 16-bit device.

Memory device 100 and processor 130 may receive power from a power supply 140. Power supply 140 represents any combination of circuitry for providing power to memory device 100 or processor 130. For example, power supply 140 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 140 using two or more potential nodes 142, such as a supply potential node (e.g., Vcc) and a ground potential node (e.g., Vss). It is not uncommon for a power supply 140 to provide more than two potential nodes 142. For example, a common standard for switched-mode power supplies, ATX (Advanced Technology eXtended) 2.0, provides, using a 28-pin connection, four potential nodes (or pins) at +3.3V, five potential nodes at +5V, four potential nodes at +12V, one potential node at −12V, and ten potential nodes at a ground potential (e.g., 0V). The ATX 2.0 standard further provides a power-on potential node for activating the foregoing potential nodes when it is pulled to ground by an external circuit, a standby potential node driven to +5V regardless of whether the other potential nodes are being driven to their respective voltages (which can be used to power the external circuit responsible for pulling the power-on potential node to ground), and a power-good potential node for indicating when the other potential nodes are stabilized at their respective voltages. The remaining pin of the ATX 2.0 28-pin standard is undefined. Memory device 100 and processor 130 may utilize differing combinations of potential nodes 142 from power supply 140 depending upon their respective power needs.

Processor 130 may be configured to detect whether a particular (e.g., line-connected) power supply is available, such as where power supply 140 can include more than one power supply, such as both a stand-alone power supply and a line-connected power supply. Processor 130 might then be configured to operate connected apparatus, such as the memory device 100, in different modes depending upon what power supplies are available. For example, the processor 130 might be configured to operate the memory device 100 in a retention mode of operation in accordance with an embodiment when a line-connected power supply is available, and might be configured to operate the memory device 100 in a normal mode when a line-connected power supply is not available. For example, when a line-connected power supply is available, the processor 130 might instruct the memory device 100 to write a value to the control register 126 (e.g., by the control logic 116) to indicate that a retention mode of operation is enabled, such that the memory device 100 could perform the retention mode of operation autonomously while the retention mode of operation is enabled. When the line-connected power supply is no longer available, the processor 130 could then instruct the memory device 100 to write a value to the control register 126 to indicate that the retention mode of operation is disabled. Alternatively, or in addition, the processor 130, if a line-connected power supply is available, might send a command to the memory device 100 to instruct the memory device 100 to enter the retention mode of operation between commands to access (e.g., read, program or erase) the array of memory cells 104.

It will be appreciated by those skilled in the art that additional circuitry and signals can be provided, and that the electronic system of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O, command and power pins are described in accordance with popular conventions for receipt and output of the various signals, it is noted that other combinations or numbers of pins may be used in various embodiments.

Figure 2A:
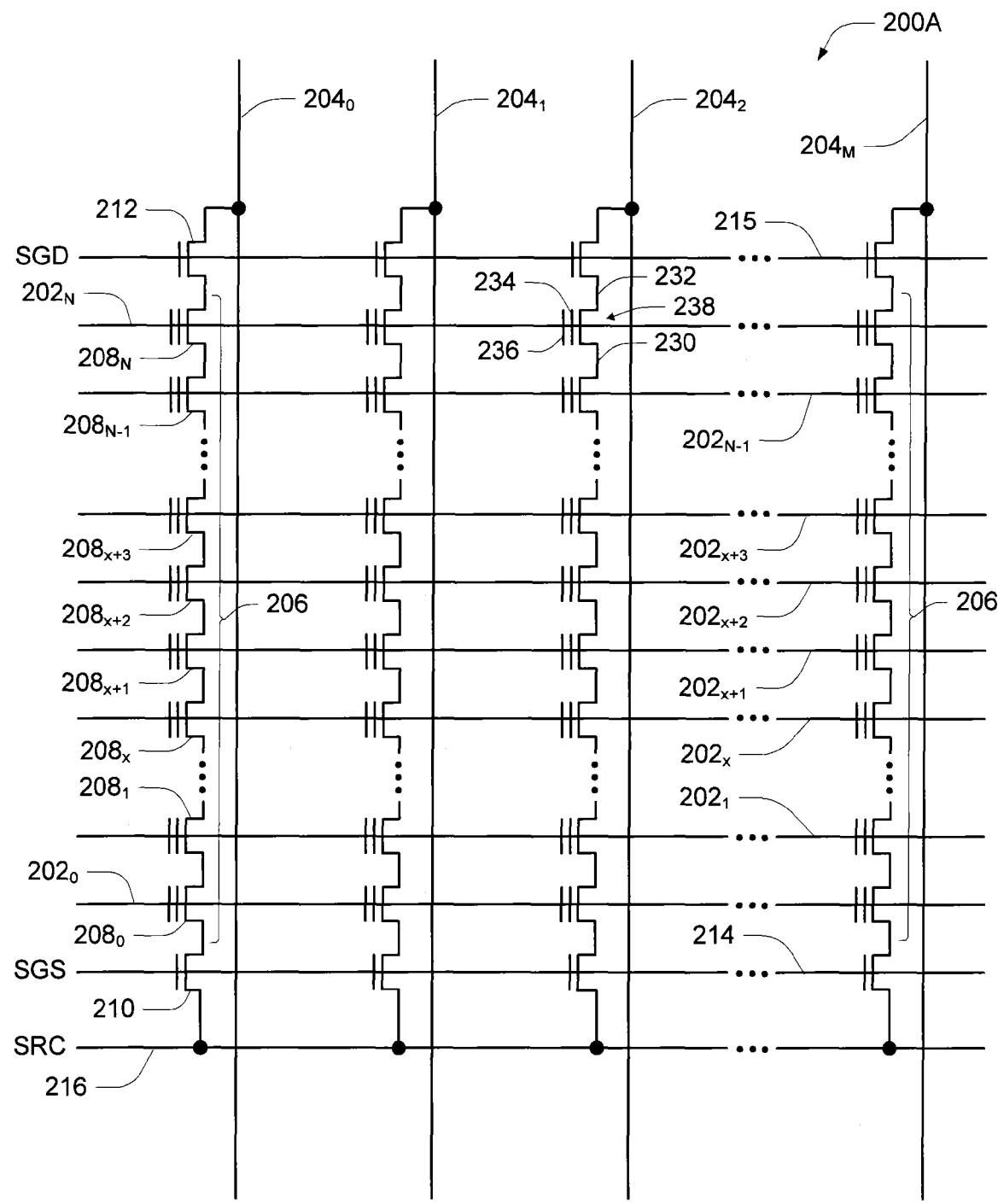
FIGS. 2A-2B are schematics of portions of arrays of memory cells as could be used in a memory device of the type described with reference to FIG. 1.

FIG. 2A is a schematic of an array of memory cells 200A, e.g., as a portion of the array of memory cells 104, in accordance with an embodiment. Array of memory cells 200A includes access lines, such as word lines $202_0$ to $202_N$, and intersecting data lines, such as bit lines $204_0$ to $204_M$. For ease of addressing in the digital environment, the number of word lines 202 and the number of bit lines 204 are generally each some power of two, e.g., 256 word lines 202 by 4,096 bit lines 204.

Array of memory cells 200A is arranged in rows (each corresponding to a word line 202) and columns (each corresponding to a bit line 204). Each column may include a string of memory cells 208, such as one of the NAND strings 206. Each NAND string 206 may be coupled to a common source (SRC) 216 and includes memory cells $208_0$ to $208_N$, each located at an intersection of a word line 202 and a bit line 204. The memory cells 208, depicted as floating-gate transistors in FIG. 2A, represent non-volatile memory cells for storage of data. Memory cells 208 may be, for example, enhancement mode (e.g., n-type) transistors. The memory cells 208 of each NAND string 206 are connected in series, source to drain, between a source select line (SGS) 214 and a drain select line (SGD) 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212. Arrays of memory cells utilizing more than one select gate at one or both ends of a NAND string 206 are known. If multiple source select gates 210 are utilized for a given string of memory cells 206, they could be coupled in series between the common source 216 and the memory cell $208_0$ of that string of memory cells 206. If multiple drain select gates 212 are utilized for a given string of memory cells 206, they could be coupled in series between the corresponding bit line 204 and the memory cell $208_N$ of that string of memory cells 206.

A source of each source select gate 210 is connected to common source 216. The drain of each source select gate 210 is connected to the source of the memory cell 208 of a corresponding NAND string 206. Therefore, each source select gate 210 selectively couples its corresponding NAND string 206 to common source 216. A control gate of each source select gate 210 is connected to source select line 214.

The drain of each drain select gate 212 is connected to the bit line 204 for the corresponding NAND string 206. The source of each drain select gate 212 is connected to the drain of the last memory cell $208_N$ of its corresponding NAND string 206. Therefore, each drain select gate 212 selectively couples a corresponding NAND string 206 to a corresponding bit line 204. A control gate of each drain select gate 212 is connected to drain select line 215.

Typical construction of memory cells 208 includes a source 230 and a drain 232, a data-storage structure 234 (e.g., a floating gate, charge trap, etc.) that can determines a data state of the cell (e.g., through changes in threshold voltage), a control gate 236, and a body 238 (e.g., a semiconductor on which the memory cell 208 is formed), as shown in FIG. 2A. Memory cells 208 have their control gates 236 coupled to (and in some cases from) a word line 202. A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one row of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another row of memory cells 208 (e.g., odd memory cells). Although bit lines $204_3$-$404_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a row of memory cells 208.

Figure 2B:
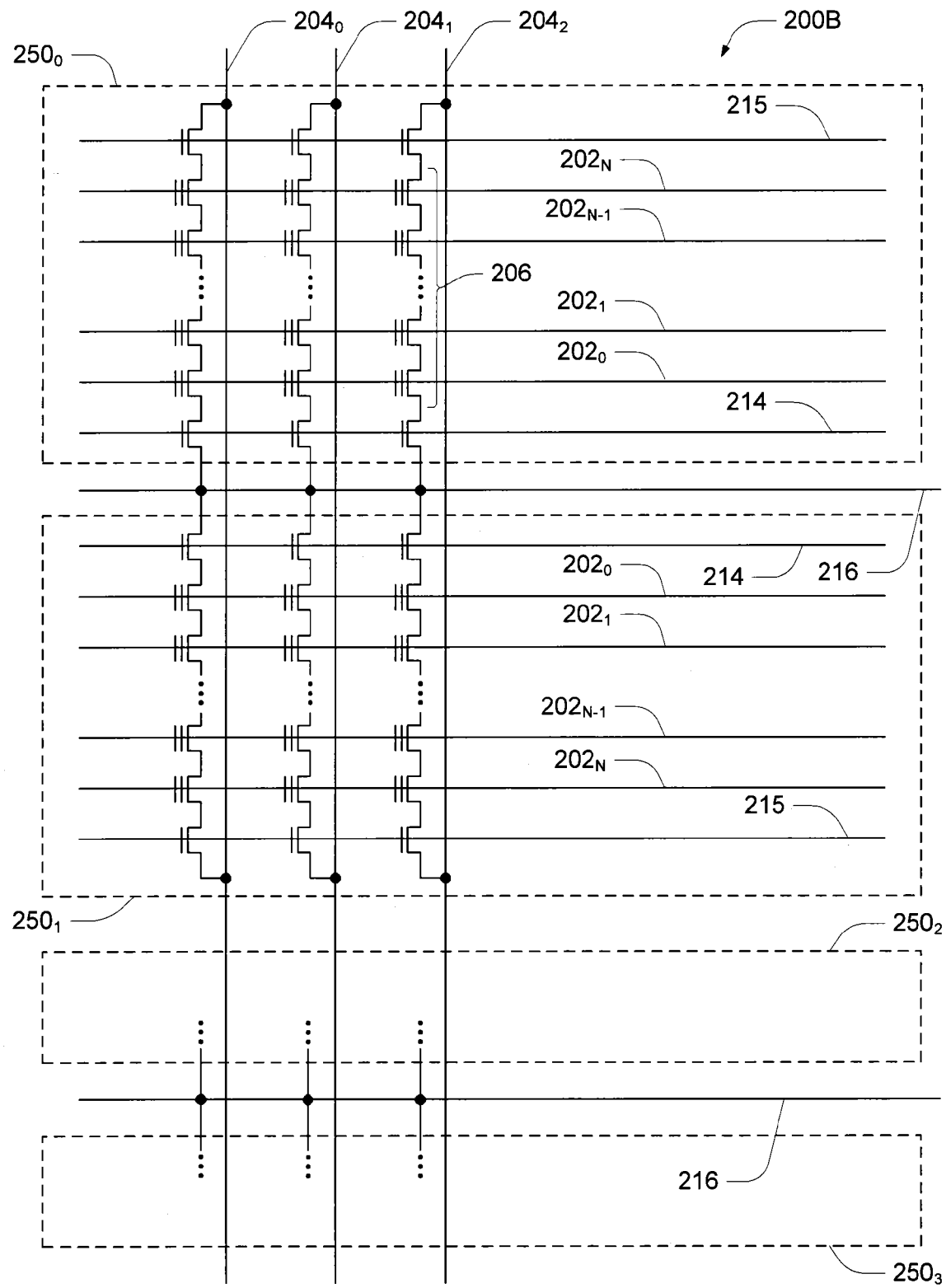

FIG. 2B is a schematic of an array of memory cells 200B, e.g., as a portion of the array of memory cells 104, in accordance with another embodiment. Array of memory cells 200B may include NAND strings 206, word lines 202, bit lines 204, source select lines 214, drain select lines 215 and common source 216 as depicted in FIG. 2A. The array of memory cells 200A may be a portion of the array of memory cells 200B, for example. FIG. 2B depicts groupings of NAND strings 206 into blocks 250. Blocks 250 may be erase blocks, e.g., groupings of memory cells 208 that may be erased together in a single erase operation.

Although the examples of FIGS. 2A-2B were discussed in conjunction with NAND architecture memory, the embodiments described herein are not limited to NAND architecture memory. As such, the array of memory cells 104 can include other memory architectures, such as NOR architecture, AND architecture, etc.

Figure 3:
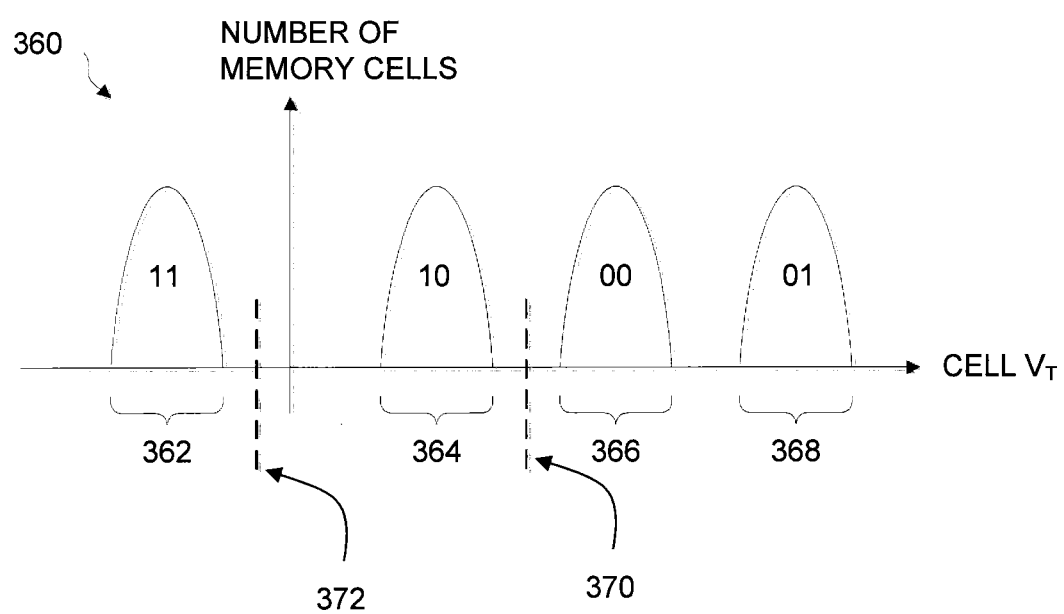
FIG. 3 is a graphical representation of threshold voltage ranges in an example population of memory cells.

FIG. 3 illustrates an example of Vt ranges 360 as might represent a population of MLC (four level) (e.g., 2-bit) memory cells for use in discussing various embodiments. For example, a memory cell might be programmed to a Vt that falls within one of four different Vt ranges 362-368 of 200 mV, each being used to represent a data state corresponding to a bit pattern comprised of two bits. Typically, a dead space (e.g., sometimes referred to as a margin, and which might have a range of 200 mV to 400 mV) is maintained between each Vt range 362-368 to keep the ranges from overlapping. As an example, if the Vt of a memory cell is within the first of the four Vt ranges 362, the cell in this case is storing a logical '11' state and is typically considered the erased state of the cell. If the Vt is within the second of the four Vt ranges 364, the cell in this case is storing a logical '10' state. A Vt in the third Vt range 366 of the four Vt ranges would indicate that the cell in this case is storing a logical '00' state. Finally, a Vt residing in the fourth Vt range 368 indicates that a logical '01' state is stored in the cell.

Floating-gate memory cells of a particular size (e.g., having a particular channel length and width, and a particular floating gate volume) might have a neutral Vt ($Vt_0$) occurring at dashed line 370 along the continuum of threshold voltages. The neutral Vt represents the threshold voltage that the memory cell might naturally assume over time absent external driving forces to add or remove charge from the floating gate. As the geometries of floating-gate memory cells are reduced, the neutral Vt may tend to move lower within the continuum of threshold voltages. For example, floating-gate memory cells of the same construction as the memory cells having the neutral Vt occurring at dashed line 370, but smaller, might have a neutral Vt occurring at dashed line 372. As the neutral Vt moves closer to either extreme of the continuum of threshold voltages, the pull on certain memory cells to move toward their neutral Vt, i.e., those memory cells having data states closer to the other extreme of the continuum of threshold voltages, can increase. As an example, memory cells programmed to a Vt within Vt range 368 might have a stronger tendency to see a shift (e.g., a reduction) in threshold voltage over time if their neutral Vt occurs at dashed line 372 rather than at dashed line 370, while memory cells programmed to a Vt within Vt range 362 might have a lesser tendency to see a shift (e.g., an increase) in threshold voltage over time if their neutral Vt occurs at dashed line 372 rather than at dashed line 370. Various embodiments seek to mitigate this imbalance, e.g., to even out the natural pull toward the neutral Vt such that memory cells programmed to threshold voltages at either end of the continuum of threshold voltages experience similar tendencies toward their neutral Vt, thereby reducing the maximum electric field across gate dielectrics of a random population of memory cells. Mitigating this imbalance may facilitate an improvement in data retention of an array of memory cells.

An indicator of this tendency to shift threshold voltages might be expressed as an electric field across a memory cell. This electric field may be represented as a voltage across the gate dielectric of a memory cell ($V_{ox}$), and might be given by Equation 1:

$$V_{ox} = \alpha_g(-V_G + Vt - Vt_0 + V_{FB}) \tag{Eq. 1}$$

where:
  $\alpha_g$ is the gate coupling ratio;
  $V_G$ is the control gate voltage;
  Vt is the threshold voltage;
  $Vt_0$ is the neutral threshold voltage; and
  $V_{FB}$ is the flat-band voltage (e.g., voltage of the body).

To continue with the example of FIG. 3, a first memory cell might have its neutral Vt occurring at dashed line 370 and a second memory cell might have its neutral Vt occurring at dashed line 372. Assume that dashed line 370 represents a $Vt_0$ of +1V and dashed line 372 represents a $Vt_0$ of −1V, that the gate coupling ratio of both the first memory cell and the second memory cell are the same, e.g., 0.5, that both memory cells are receiving a control gate voltage of 0V, and that both memory cells have a flat-band voltage of 0V. In this example, the first memory cell would have a $V_{ox}$ of +1.5V if its Vt were 4V (e.g., a memory cell programmed to have a threshold voltage in Vt range 368), and would have a $V_{ox}$ of −1.5V if its Vt were −2V (e.g., a memory cell programmed to have a threshold voltage in Vt range 362). However, the second memory cell would have a $V_{ox}$ of +2.5V if its Vt were 4V (e.g., a memory cell programmed to have a threshold voltage in Vt range 368), and would have a $V_{ox}$ of −0.5V if its Vt were −2V (e.g., a memory cell programmed to have a threshold voltage in Vt range 362). Presuming that data retention of an array of memory cells generally varies inversely with max($|V_{ox}|$) (a maximum absolute value of $V_{ox}$) for the various data states to which a memory cell of that array might be programmed, it may be desirable to reduce this value.

Reducing max($|V_{ox}|$) for a memory cell that does not have its $Vt_0$ occurring midway between its highest programmed threshold voltage and its lowest programmed threshold voltage can be achieved by applying a non-zero voltage differential across the memory cell, by biasing the control gate, the body or both, while the memory cell is not being accessed. As used herein, applying a non-zero voltage differential across the memory cell involves actively driving a voltage differential and does not include passive voltage differentials, such as inherent voltage differentials due the a charge level stored by the memory cell, coupling effects that might induce a voltage differential between a floating control gate and a floating body, or voltage differentials that might result from a control gate and a body being coupled to a same potential node, but equilibrating at different potential levels due to differences in path to the potential node or the like.

In this example of a memory cell having a $Vt_0$ of −1V, a highest programmed threshold voltage of +4V, and a lowest programmed threshold voltage of −2V, a theoretical minima of max($|V_{ox}|$) could then be obtained by applying a control gate voltage ($V_G$) of +2V while the body is maintained at a ground potential (e.g., 0V). It will be apparent that similar results could be obtained by instead applying a voltage to the body of −2V while a voltage to the control gate is maintained at the ground potential, or applying a voltage to the substrate of −1V and a voltage to the control gate of +1V, etc. In addition, where a desired $V_G$ to reduce max($|V_{ox}|$) in Eq. 1 is negative, a positive voltage could be applied to the body while the control gate is biased to a ground potential, for example. Thus, while examples may refer to applying a particular $V_G$, it is to be understood that equivalent application of voltages across the gate dielectric, either through the body, the control gate or both, can be readily substituted to achieve the desired voltage differential to reduce max($|V_{ox}|$).

Figure 4:
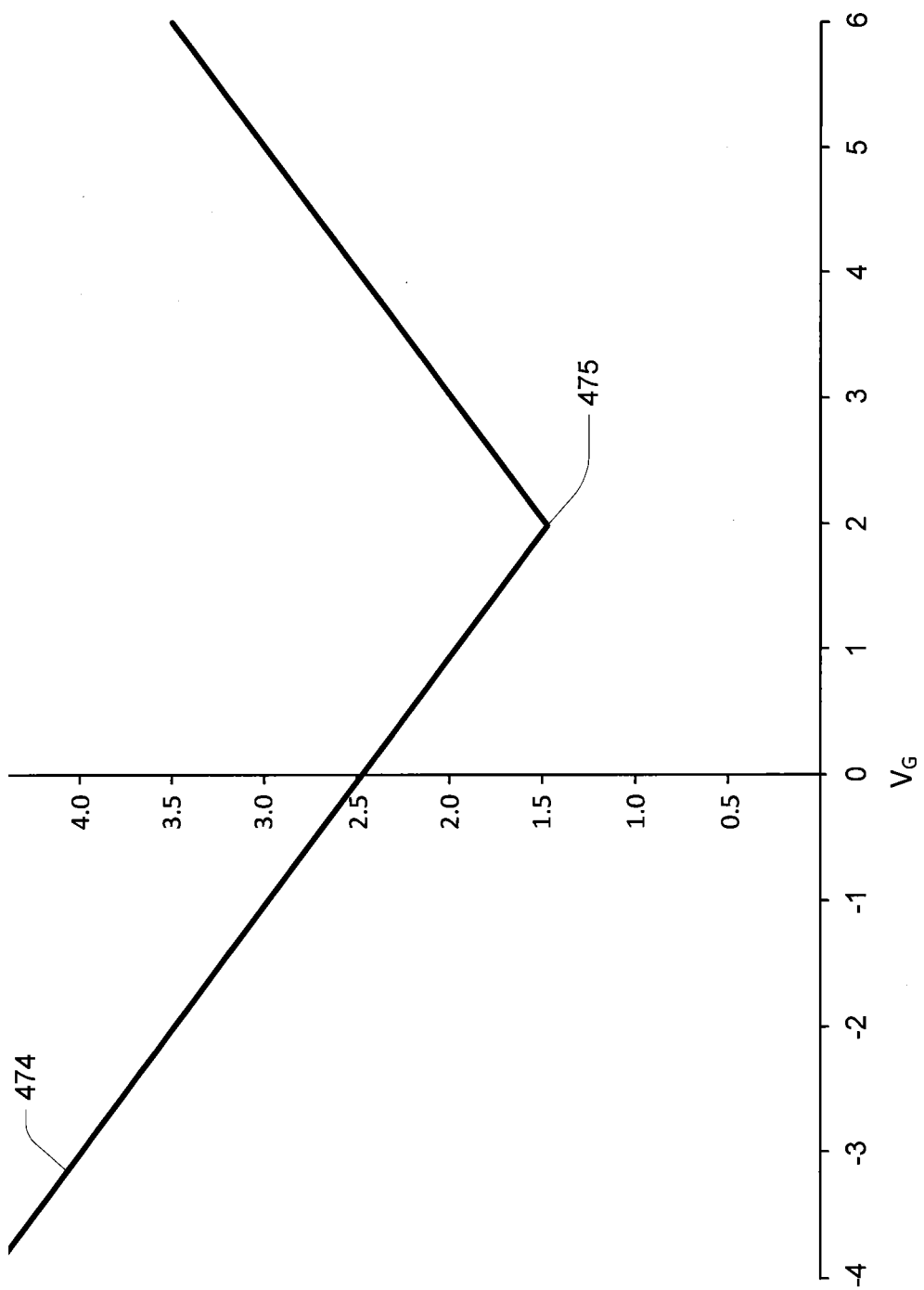
FIG. 4 is a chart showing one example of a plot of maximum absolute values for voltages across the gate dielectric that a memory cell might experience across the continuum of threshold voltages representing possible data states of the memory cell.

FIG. 4 is a chart showing one example of a plot 474 of max($|V_{ox}|$) for Equation 1, where $\alpha_g$=0.5, $Vt_0$ is −1V, $V_{FB}$ is 0V, the highest programmed threshold voltage is +4V, the lowest programmed threshold voltage is −2V, and $V_G$ is varied from −4V to +6V. As depicted in FIG. 4, the slope of plot 474 is negative until it reaches a theoretical minima 475 at $V_G$=+2V, then turns positive for increasing values of $V_G$. As such, it is expected that increases in data retention could be facilitated by applying a non-zero, and in this particular example, positive voltage differential (e.g., from the control gate to the body) across the memory cells when they are not being accessed (e.g., accessed during a read operation, erase operation or programming operation). For this particular example, increases in data retention might be expected for values of $V_G$ of greater than 0V and less than +4V as the values of max($|V_0|$) for plot 474 within this range would be less than the value of max($|V_{ox}|$) at $V_G$=0V. For certain embodiments, voltages applied when memory cells are not being accessed are selected to result in a reduction of max ($|V_{ox}|$) of at least 20% from its value at $V_G$=0V. In the example of FIG. 4, this would represent a range of values of $V_G$ from +1V to +3V. For further embodiments, voltages applied when memory cells are not being accessed are selected to result in values of max($|V_{ox}|$) of within 20% of its theoretical minima. In the example of FIG. 4, this would represent a range of values of $V_G$ from +1.4V to +2.6V.

Table 1 is an example of voltages that might be applied during a read operation and a retention mode of operation for a NAND string of memory cells in accordance with an embodiment. Table 1 lists example voltages with reference to the nodes depicted in FIG. 2A, and assumes that $202_x$ is the selected word line for the read operation.

TABLE 1

| Node | Read Operation | Retention Mode of Operation |
|---|---|---|
| 215 | 6 V | 0 V or float |
| $202_0$ | 6 V | 2 V |
| $202_x$ | Vread | 2 V |
| $202_{x+1}$ | 6 V | 2 V |
| $202_{x+2}$ | 6 V | 2 V |
| $202_{x+3}$ | 6 V | 2 V |
| $202_{N-1}$ | 6 V | 2 V |
| $202_N$ | 6 V | 2 V |
| 214 | 4 V | 0 V or float |
| 238 | 0 V | 0 V |

As shown in Table 1, during the read operation, the selected word line $202_x$ would receive a read voltage (Vread) insufficient to activate memory cells coupled to this word line if they have a particular data state that the read operation is attempting to sense, and sufficient to activate memory cells coupled to this word line if they have a lower data state. Remaining word lines $202_0$-$202_N$ would receive a voltage (e.g., a pass voltage) sufficient to activate memory cells coupled to those word lines without regard to their data states, e.g., 6V in this example. Source select line 214 and drain select line 215 would each receive a voltage sufficient to activate their corresponding select gates, e.g., 4V and 6V, respectively, in order to couple the NAND string of memory cells to both the common source 216 and a bit line 204. The body 238 of each memory cell is typically held to a ground potential, e.g., 0V.

During the retention mode of operation, each of the word lines $202_0$-$202_N$ would receive substantially the same (e.g., the same) voltage, selected in conjunction with a voltage applied to the body 238 (e.g., 0V), to apply a non-zero voltage across the memory cells coupled to the word lines $202_0$-$202_N$ to facilitate a reduction of max($|V_{ox}|$) for the range of data states the memory cells might assume. Voltages are considered to be substantially the same when they are intended to be the same voltage, such as when two different nodes are driven by the same or similarly configured power supply node, are coupled to the same or similarly configured internal voltage generator, or are otherwise intended to be powered by the same potential node, even though differences in the characteristics of the circuit elements (e.g., resistance differences in the circuit path, fabrication differences in voltage generators, in-tolerance variations in power supply output, etc.) may lead to variations in the actual applied voltages for each of the nodes.

In contrast to the read operation, one or both of source select line 214 and drain select line 215 might receive a voltage to deactivate their corresponding select gates, e.g., 0V, during the retention mode of operation in order to isolate the NAND string of memory cells from the common source 216 and/or a bit line 204. While deactivation of at least one of the select gates associated with a NAND string of memory cells would serve to inhibit current flow through the NAND string of memory cells, such as when concurrently accessing one or more memory cells of another NAND string of memory cells selectively coupled to the same bit line 204, for certain embodiments, the common source 216 and the bit line 204 could be allowed to float, such as when other memory cells selectively coupled to the common source 216 and that bit line 204 are also not involved in an access operation. Where the common source 216 and the bit line 204 are allowed to float, or are maintained at the same potential, current flow through the NAND string of memory cells would not be a concern and the source select line 214 and drain select line 215 could also be allowed to float.

As noted previously, the voltages at the word lines 202 and the body 238 are relative, and are selected to produce a particular voltage differential across the memory cell to obtain a reduction of max($|V_{ox}|$) over that which would result if no voltage differential were applied across the memory cell for the range of data states the memory cells might assume. As such, the voltages of Table 1 are merely one example.

Figure 5:
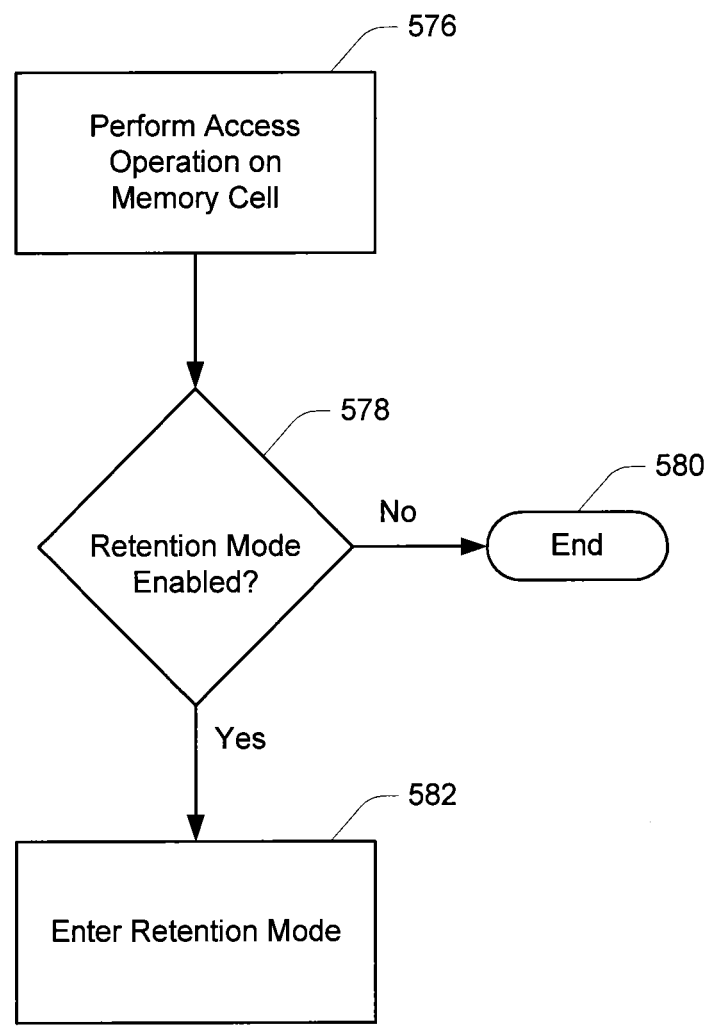
FIG. 5 is a flowchart of a method of operating a memory device in accordance with an embodiment.

FIG. 5 is a flowchart of a method of operating an apparatus, e.g., a memory device, in accordance with an embodiment. The method could be performed, for example, autonomously by control logic of the memory device. At 576, an access operation is performed on a memory cell. For example, the access operation could be a read operation to determine a data state stored by the memory cell, a programming operation to write a data state to the memory cell, or an erase operation to erase the memory cell. The access operation might be initiated in response to a command received from an external device, such as a processor. As discussed, the access operation could involve additional memory cells either directly (e.g., accessing other memory cells concurrently) or indirectly (e.g., applying voltages to memory cells to facilitate the accessing of the memory cell or other directly involved memory cells). At 578, e.g., at the completion of the access operation, a determination is made whether a retention mode of operation is enabled. If not, the method could proceed to 580 where it would end. For example, control logic of the memory device may simply wait for the next command. If it is determined that a retention mode of operation is enabled at 578, the method could proceed to 582 where it would enter the retention mode of operation. For example, in the retention mode of operation, control logic of the memory device could apply a non-zero voltage differential across the memory cell while waiting for the next command. For various embodiments, that applied voltage is selected to reduce the maximum electric field that the gate dielectric of the memory cell might experience if programmed to any threshold voltage along its continuum of data states. For various embodiments, the memory device would indicate that it is available, such as indicating the memory device is ready using a ready/busy signal or setting a status register indicating the memory device is ready, during the retention mode of operation.

For some embodiments, the retention mode of operation is entered only when no memory cell of an array of memory cells is involved in an access operation. For other embodiments, the retention mode of operation is entered for any memory cell that is not involved in an access operation, either directly or indirectly. Embodiments entering retention modes of operation only when no memory cell of an array of memory cells is involved in an access operation could simplify the control logic and utilize relatively lower power levels, while embodiments entering retention mode of operation for any memory cell that is not involved in an access operation could facilitate higher levels of improvement in data retention characteristics, but also utilize relatively higher power levels. Other embodiments might fall between these two examples, such that a retention mode of operation is entered for a subset of an array of memory cells when no memory cell of that subset is involved in an access operation. For example, with reference to FIG. 2B, word lines 202 of blocks $250_0$ and $250_1$ might be multiplexed to the same global word lines (not shown in FIG. 2B) such that applying voltages to the word lines 202 of block $250_0$ for an access operation on one or more memory cells of block $250_0$ would preclude applying voltages to the word lines 202 of block $250_1$ for a retention mode of operation, even though memory cells of block $250_1$ are not involved in an access operation. However word lines 202 of blocks $250_2$ and $250_3$ might be multiplexed to a different set of global word lines (not shown in FIG. 2B) such that a retention mode of operation could be entered for memory cells of these blocks even though one or more memory cells of blocks $250_0$ or $250_1$ are involved in an access operation as word lines 202 of blocks $250_2$ and $250_3$ could have voltages applied for the retention mode of operation while word lines 202 of block $250_0$ or $250_1$ have voltages applied for their access operation.

An apparatus, e.g., a memory device, might be configured to selectively perform one or more of these various types of retention modes of operation. For example, a 2-bit register (e.g., as part of a control register) could indicate whether any of the foregoing three examples of retention modes of operation are enabled or whether they are all disabled. A user of the memory device could then select, by writing the appropriate value to the register, which retention mode of operation, if any, the memory device should enter. The user could select the retention mode of operation based on factors such as desired power utilization and desired data retention characteristics. For some embodiments, the processor might be configured to select a type of retention mode of operation based on what power supplies are available.

Figure 6:
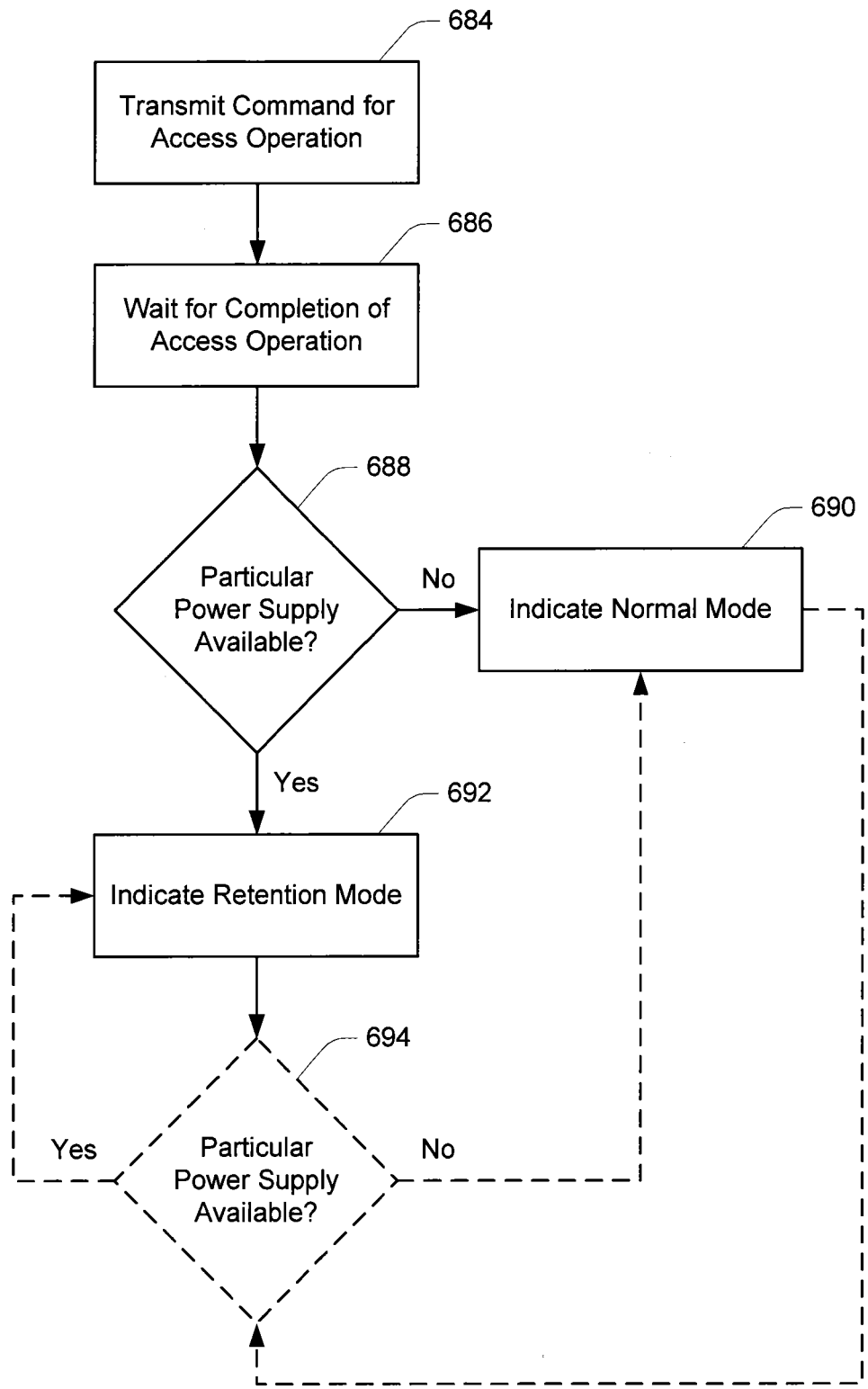
FIG. 6 is a flowchart of a method of operating an electronic system in accordance with an embodiment.

FIG. 6 is a flowchart of a method of operating an apparatus, e.g., an electronic system, in accordance with an embodiment. The method could be performed by a processor in communication with a memory device, for example. At 684, a command for an access operation is transmitted, e.g., from a processor to a memory device. The method then waits for completion of the access operation at 686. Completion of the access operation might be indicated by a ready/busy signal of a memory device, or a processor may poll a status register of a memory device to determine completion. At 688, it is determined whether a particular, e.g., line-connected, power supply is available. Such ability to determine what power supplies are available is common in laptop computers, for example.

If the particular power supply is not available at 688, the method might proceed to 690 to indicate that a normal mode of operation is desired. For example, if a retention mode of operation is entered by an apparatus, e.g., a memory device, in response to an external command, the method might simply do nothing, i.e., not transmit a command to place the memory device in a retention mode of operation. For an apparatus, e.g., a memory device, utilizing a register to indicate whether a retention mode of operation is enabled or disabled, the method might transmit a command to the memory device to write a value to the register to indicate that retention modes of operation are disabled, or it might do nothing if the register currently contains that value.

If the particular power supply is available at 688, the method might proceed to 692 to indicate that a retention mode of operation is desired. For example, if a retention mode of operation is entered by an apparatus, e.g., a memory device, in response to an external command, the method might transmit a command to place the memory device in a retention mode of operation. Where multiple retention modes of operation are available, the command might further specify which type of retention mode of operation is desired. For an apparatus, e.g., a memory device, utilizing a register to indicate whether a retention mode of operation is enabled or disabled, the method might transmit a command to the memory device to write a value to the register to indicate which retention mode of operation is enabled, or it might do nothing if the register currently contains that value.

For some embodiments, it may be desirable to continue to monitor whether the particular, e.g., line-connected, power supply is available. For example, if a line-connected power supply were no longer available, and the apparatus switched to a battery, it might be desirable to limit the power demands of the apparatus by discontinuing the application of voltages across memory cells not involved in an access operation and reverting to a normal mode of operation, i.e., where memory cells not involved in an access operation are not actively driven. Conversely, if a line-connected power supply becomes available while the apparatus is in a normal mode of operation, it may be desirable to enter a retention mode of operation to improve data retention characteristics. As such, both 690 and 692 might proceed to 694 where it is determined, e.g., periodically or through interrupts, whether the particular power supply is available, which would proceed to 692 if the particular power supply is or becomes available, and would proceed to 690 if the particular power supply is not or is no longer available.

While applying voltages across memory cells when they are not being accessed can be used to facilitate increases in data retention, such operation would generally utilize more power than normal operation. Furthermore, if a block of memory cells contained a defect, this could lead to large, and unnecessary, current draws, such as in the case of an electrical short defect. As such, it may be desirable to avoid applying such voltages to the memory cells of defective blocks during the retention mode of operation.

Figure 7:
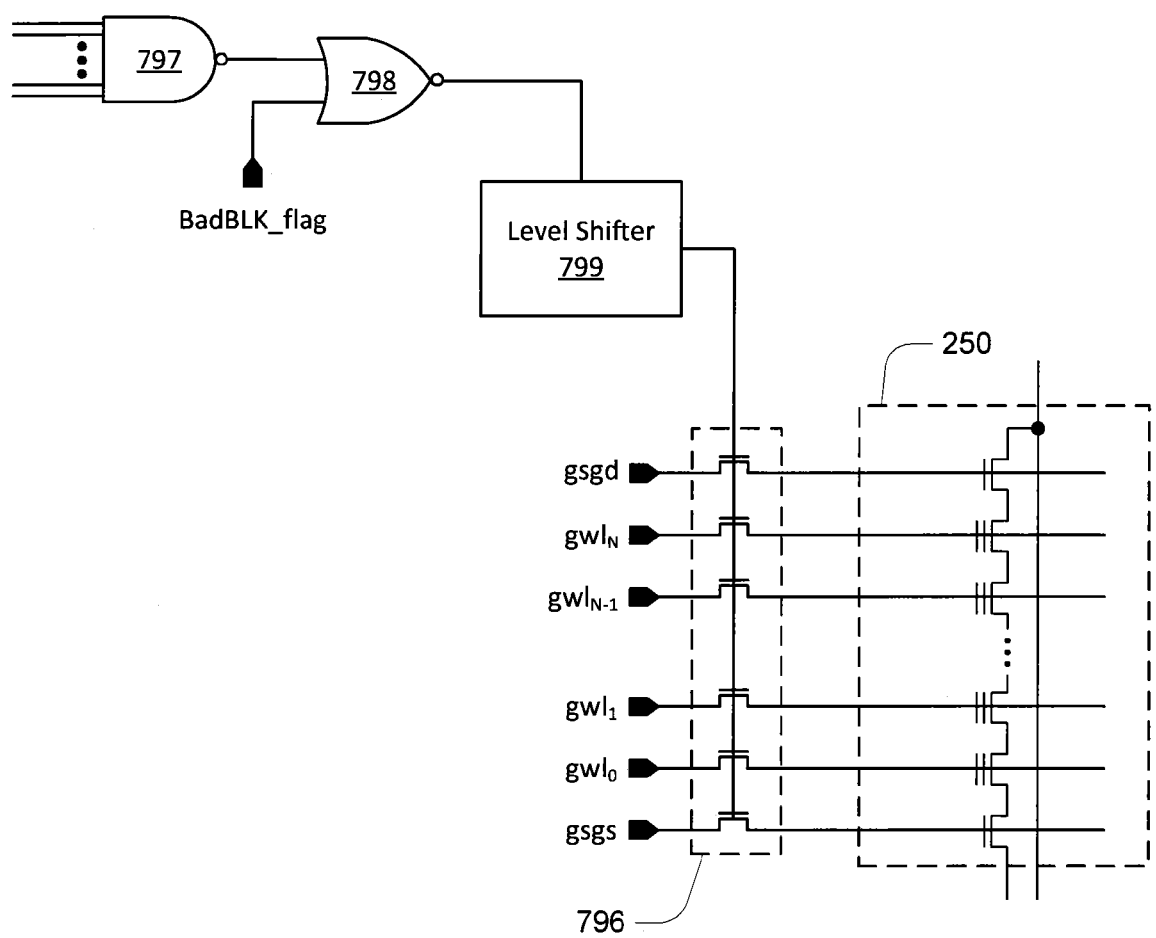
FIG. 7 is a schematic of a portion of an array of memory cells showing combinatorial logic for use with embodiments.

FIG. 7 is a schematic of a portion of an array of memory cells showing combinatorial logic for use with embodiments. FIG. 7 depicts a block of memory cells 250, such as shown in more detail in FIGS. 2A and 2B. The block of memory cells 250 is selectively coupled to global word lines (e.g., $gwl_0$-$gwl_N$) and global source select line (e.g., gsgs) and global drain select line (e.g., gsgd) through a multiplexer 796, only a portion of which is shown for clarity. In operation, NAND gate 797 outputs a logic 0 on its output if the address of the access operation matches the block address of block 250, and outputs a logic 1 level if there is no match. The output of the NAND gate 797 is provided as one input to NOR gate 798, and a bad block flag (BadBLK_flag) indicative of whether the block 250 has been deemed to be defective is provided as the other input to NOR gate 798. The bad block flag has a logic 1 level if block 250 is deemed defective, and a logic 0 level if it is not deemed defective. As such, NOR gate 798 would have a logic 1 level if there was an address match and the block was not deemed defective, and would have a logic 0 level if there was no address match or the block was deemed defective. The output of the NOR gate 798 can be used to selectively activate the level shifter 799, e.g., in response to a logic 1 level, which in turn can be used to selectively activate the transistors of the multiplexor 796 corresponding to the block 250. In this manner, even if the voltages for the retention mode of operation are applied to global word lines, the word lines of the block 250 can be isolated and allowed to float if the block is deemed defective, thereby mitigating any current draw.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells;
a register; and
a control logic to control access to the array of memory cells;
wherein the control logic is configured to apply a non-zero voltage differential across a memory cell of the array of memory cells that is not involved in an access operation if the register has a particular value.

2. The apparatus of claim 1, wherein the control logic is further configured to not apply the non-zero voltage differential across the memory cell if the register has a second value different than the particular value.

3. The apparatus of claim 1, wherein control logic is further configured to apply the non-zero voltage differential across all memory cells of the array of memory cells only when no memory cell of the array of memory cells is involved in an access operation if the particular value has a first value, to apply the non-zero voltage differential across the memory cell and all other memory cells of the array of memory cells that are not involved in an access operation if the particular value has a second value, to apply the non-zero voltage differential across the memory cell and all other memory cells of a subset of memory cells of the array of memory cells when no memory cell of the subset of memory cells of the array of memory cells is involved in an access operation if the particular value has a third value, and to not apply the non-zero voltage differential across the memory cell if the register has a second value different than the particular value.

4. The apparatus of claim 1, wherein the control logic is further configured to indicate to an external device that the apparatus is ready to initiate an access operation while applying the non-zero voltage differential across the memory cell.

5. The apparatus of claim 1, wherein the non-zero voltage differential across the memory cell comprises applying a first voltage to a control gate of the memory cell and applying a second voltage to a body of the memory cell.

6. The apparatus of claim 5, wherein the first voltage is greater than the second voltage.

7. The apparatus of claim 6, wherein the first voltage is a positive voltage and the second voltage is a ground potential.

8. The apparatus of claim 5, wherein the second voltage is greater than the first voltage.

9. The apparatus of claim 8, wherein the second voltage is a positive voltage and the first voltage is a ground potential.

10. The apparatus of claim 1, wherein the access operation is selected from the group consisting of a read operation, an erase operation, and a programming operation.

11. The apparatus of claim 1, wherein the memory cell is not involved in an access operation when the apparatus is ready to initiate an access operation.

12. The apparatus of claim 1, wherein the control logic is configured to not apply the non-zero voltage differential across the memory cell if it is deemed defective.

13. An apparatus, comprising:
an array of memory cells comprising NAND strings of memory cells;
a control logic to control access to the array of memory cells;
wherein the control logic is configured to apply substantially the same non-zero voltage differential across each memory cell of a NAND string of memory cells of the array of memory cells when no memory cell of the NAND string of memory cells is involved in an access operation; and
wherein the non-zero voltage differential is a positive voltage differential from a control gate to a body of each memory cell of the NAND string of memory cells.

14. The apparatus of claim 13, wherein each memory cell of the NAND string of memory cells is an enhancement mode transistor.

15. The apparatus of claim 13, wherein the control logic is further configured to apply substantially the same non-zero voltage differential across each memory cell of the NAND string of memory cells when no memory cell of the NAND string of memory cells is involved in an access operation if no memory cell of the array of memory cells is involved in an access operation.

16. The apparatus of claim 13, wherein the control logic is further configured to apply substantially the same non-zero voltage differential across each memory cell of the NAND string of memory cells when no memory cell of the NAND string of memory cells is involved in an access operation, in response to a command from a second apparatus external to the apparatus.

17. The apparatus of claim 13, wherein the control logic is further configured to apply substantially the same non-zero voltage differential across each memory cell of the NAND string of memory cells when no memory cell of the NAND string of memory cells is involved in an access operation, when a register of the apparatus has a particular value.

18. An apparatus, comprising:
an array of memory cells comprising a NAND string of memory cells selectively coupled to a data line through a first select gate and selectively coupled to a common source through a second select gate;
a control logic to control access to the array of memory cells;
wherein the control logic is configured to apply substantially the same non-zero voltage differential across each memory cell of the NAND string of memory cells while deactivating at least one of the first select gate and the second select gate.

19. The apparatus of claim 18, wherein the control logic is further configured to apply substantially the same non-zero voltage differential across each memory cell of the NAND string of memory cells while deactivating at least one of the first select gate and the second select gate when no memory cell of the NAND string of memory cells is involved in an access operation.

20. The apparatus of claim 18, wherein the control logic is configured to apply substantially the same non-zero voltage differential across each memory cell of the NAND string of memory cells while deactivating at least one of the first select gate and the second select gate and while indicating that the apparatus is ready to initiate an access operation on a memory cell of the array of memory cells.

21. An apparatus, comprising:
an array of memory cells comprising a NAND string of memory cells selectively coupled to a data line through a first select gate and selectively coupled to a common source through a second select gate;
a control logic to control access to the array of memory cells;
wherein the control logic is configured to apply substantially the same non-zero voltage differential across each memory cell of the NAND string of memory cells while floating a control gate of the first select gate and floating a control gate of the second select gate.

22. A method of operating an apparatus, comprising:
performing an access operation on a memory cell of the apparatus;
determining if a retention mode of operation is enabled for the apparatus, wherein the retention mode of operation comprises applying a non-zero voltage differential across the memory cell when the memory cell is not involved in an access operation; and
if the retention mode of operation is enabled, entering the retention mode of operation when the access operation is complete.

23. The method of claim 22, wherein performing an access operation on a memory cell of the apparatus comprises performing an access operation selected from the group consisting of a read operation, an erase operation, and a programming operation.

24. The method of claim 22, wherein determining if a retention mode of operation is enabled for the apparatus comprises determining a value of a register of the apparatus.

25. The method of claim 22, wherein determining if a retention mode of operation is enabled for the apparatus comprises determining which of a plurality of retention modes of operation is enabled for the apparatus.

26. The method of claim 22, further comprising selecting the non-zero voltage differential to result in a reduction of $\max(|V_{ox}|)$ (a maximum absolute value of a voltage across a gate dielectric of the memory cell for various data states to which the apparatus is configured to program the memory cell) of at least 20 percent.

27. The method of claim 22, further comprising selecting the non-zero voltage differential to result in values of $\max(|V_{ox}|)$ (a maximum absolute value of a voltage across a gate dielectric of the memory cell for various data states to which the apparatus is configured to program the memory cell) to within 20 percent of a theoretical minima of $\max(|V_{ox}|)$.

28. A method of operating an apparatus, comprising:
transmitting a command for an access operation on the array of memory cells;
waiting for completion of the access operation;
determining whether a particular power supply is available; and
indicating a retention mode of operation is desired in response to determining that the particular power supply is available;
wherein the retention mode of operation comprises applying a non-zero voltage differential across the memory cell when the memory cell is not involved in an access operation.

29. The method of claim 28, wherein the retention mode of operation comprises applying the non-zero voltage differential across the memory cell only when no memory cell of a group of memory cells containing the memory cell is involved in an access operation.

30. The method of claim 29, wherein the retention mode of operation comprises applying the non-zero voltage differential across the memory cell only when no memory cell of the array of memory cells is involved in an access operation.

31. The method of claim 28, wherein determining whether a particular power supply is available comprises determining whether a line-connected power supply is available.

32. The method of claim 28, wherein indicating a retention mode of operation is desired in response to determining that the particular power supply is available further comprises selecting a particular retention mode of operation in response to what power supplies are available.

33. The method of claim 28, further comprising selecting the retention mode of operation from a plurality of retention modes of operation.

34. The method of claim 33, further comprising selecting the retention mode of operation from the plurality of retention modes of operation based on factors selected from the group consisting of desired power utilization and desired data retention characteristics.

35. The method of claim 28, further comprising:
monitoring whether the particular power supply continues to be available; and
indicating that the retention mode of operation is no longer desired in response to determining that the particular power supply is no longer available.

36. The method of claim 28, further comprising:
monitoring whether the particular power supply again becomes available; and
again indicating that the retention mode of operation is desired in response to determining that the particular power supply is again available.

37. A method of operating an apparatus, comprising:
determining what power supplies are available to the apparatus;
selecting a particular mode of operation for the apparatus from a plurality of modes of operation in response to determining what power supplies are available to the apparatus; and
sending an indication to the apparatus as to which mode of operation is selected;
wherein at least one mode of operation comprises applying a non-zero voltage differential across a memory cell of the apparatus when the memory cell is not involved in an access operation.

38. The method of claim 37, wherein determining what power supplies are available to the apparatus is performed by a second apparatus, external to the apparatus.

39. The method of claim 37, wherein more than one mode of operation comprises applying the non-zero voltage differential across a memory cell of the apparatus when that memory cell is not involved in an access operation.

* * * * *